US011848655B1

(12) United States Patent
Khalilia et al.

(10) Patent No.: US 11,848,655 B1
(45) Date of Patent: Dec. 19, 2023

(54) MULTI-CHANNEL VOLUME LEVEL EQUALIZATION BASED ON USER PREFERENCES

(71) Applicant: Amazon Technologies, Inc., Seattle, WA (US)

(72) Inventors: Mohammed Khalilia, Lynnwood, WA (US); Naveen Sudhakaran Nair, Issaquah, WA (US)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 17/475,550

(22) Filed: Sep. 15, 2021

(51) Int. Cl.
*H03G 5/02* (2006.01)
*G06N 20/00* (2019.01)
*G10L 17/04* (2013.01)
*G10L 25/63* (2013.01)
*G10L 25/84* (2013.01)
*G06F 3/16* (2006.01)

(52) U.S. Cl.
CPC ............. *H03G 5/025* (2013.01); *G06F 3/165* (2013.01); *G06N 20/00* (2019.01); *G10L 17/04* (2013.01); *G10L 25/63* (2013.01); *G10L 25/84* (2013.01)

(58) Field of Classification Search
CPC ........ H03G 5/025; G06F 3/165; G06N 20/00; G10L 17/04; G10L 25/63; G10L 25/84
See application file for complete search history.

(56) References Cited

U.S. PATENT DOCUMENTS

| 6,988,068 | B2 * | 1/2006 | Fado ................... G10L 13/033 704/260 |
| 8,265,300 | B2 * | 9/2012 | Reid ................... G06F 3/0484 345/440.1 |
| 9,571,054 | B2 * | 2/2017 | DiNunzio ............ H03G 3/3005 |
| 9,787,273 | B2 * | 10/2017 | Iyer ..................... H03G 3/3089 |
| 9,948,256 | B1 * | 4/2018 | Dow ...................... H03G 3/001 |
| 9,973,163 | B1 * | 5/2018 | Desmond ............... H03G 5/025 |
| 10,771,277 | B1 * | 9/2020 | Angadi .................... H03G 3/32 |
| 11,481,628 | B2 * | 10/2022 | Coover ................. H03G 5/005 |
| 2016/0335043 | A1 * | 11/2016 | Guyott .................. H03G 5/025 |
| 2019/0362318 | A1 * | 11/2019 | Ledet ...................... H04L 67/55 |
| 2020/0162048 | A1 * | 5/2020 | Cremer ............... H03G 3/3005 |
| 2020/0329311 | A1 * | 10/2020 | Kalathur ................. G06F 3/017 |
| 2020/0412313 | A1 * | 12/2020 | Coover .................... H03G 3/02 |
| 2021/0158148 | A1 * | 5/2021 | Coover .................... G06N 3/08 |

* cited by examiner

*Primary Examiner* — Akelaw Teshale
(74) *Attorney, Agent, or Firm* — Eversheds Sutherland (US) LLP

(57) ABSTRACT

Systems, devices, and methods are provided for multi-stem volume equalization, wherein the volume levels of each stem may be adjusted non-uniformly. Audio may be diarized into a plurality of stems, including background noise separate. Mean and variance of the volume levels of the stems may be computed. Each audio stem may be automatically adjusted based on a stem-specific preference that a user may specify. View may adjust actor volume relative to the mean/variance that maintains a relative difference in volume levels between stems.

20 Claims, 8 Drawing Sheets

MULTI-CHANNEL VOLUME LEVEL EQUALIZATION BASED ON USER PREFERENCES

BACKGROUND

In audio content, different speakers—as well as background sound or music—may be presented at different audio levels. Speakers may have louder or quieter voices, as compared to others, which may cause discomfort to a listener who prefers to have the volume set to a certain level. When audio from a first speaker is provided at a first audio level and then audio from a second speaker is provided at a second louder or quieter level, the change may cause a listener to adjust the volume level on an audio playback device (e.g., speakers). Repeatedly changing the volume level of an audio playback device may be cumbersome and frustrating for listeners. However, attempts to flatten the volume level among different speakers may adversely affect the creative intent of the audio source.

Figure 1:
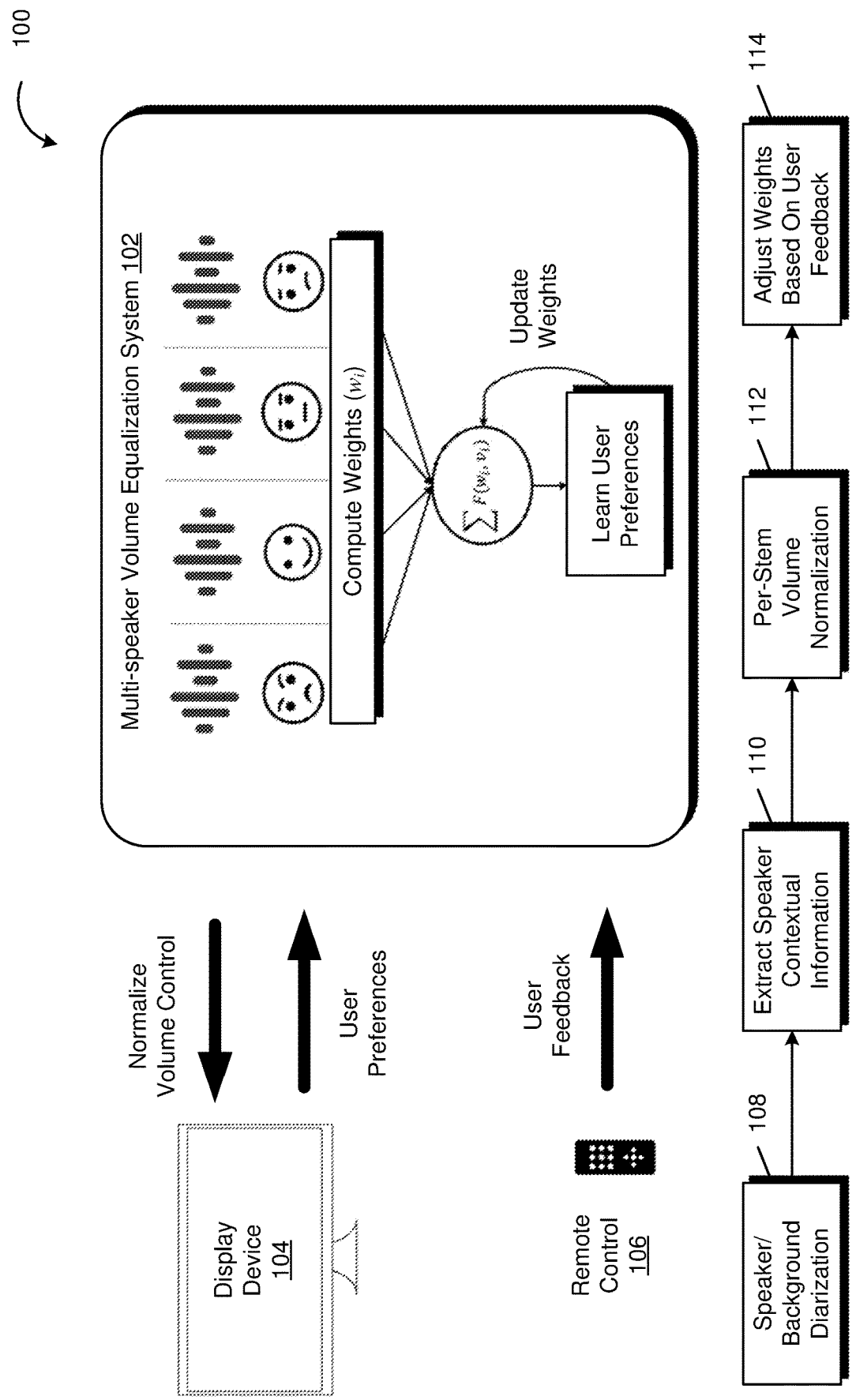
FIG. 1 illustrates a computing environment in which speaker-specific volume level equalization may be practiced, in accordance with one or more example embodiments of the present disclosure.

Certain implementations will now be described more fully below with reference to the accompanying drawings, in which various implementations and/or aspects are shown. However, various aspects may be implemented in many different forms and should not be construed as limited to the implementations set forth herein; rather, these implementations are provided so that this disclosure will be thorough and complete, and will fully convey the scope of the disclosure to those skilled in the art. Like numbers in the figures refer to like elements throughout. Hence, if a feature is used across several drawings, the number used to identify the feature in the drawing where the feature first appeared will be used in later drawings.

DETAILED DESCRIPTION

Example embodiments described herein provide certain systems, methods, and devices for speaker-specific volume level equalization in audio content. The volume in audio content such as movies, television shows, podcasts, etc. is constantly changing. For example, background music may be so loud that it drowns out the dialogue between two speakers. Furthermore, different speakers may have louder or quieter voices compared to others, may be speaking or expressive themselves with different emotions, and so forth. Personalized speaker volume level adjustment or equalization may be performed according to techniques described herein to adjust per-speaker volume levels in audio content that reduces or eliminates the need for listeners to perform manual volume adjustments through the audio content, while also maintaining the creative intent of the audio content creator.

Techniques described here may be utilized to perform speaker diarization and volume normalization. An audio track for audio content, such as a movie or television show, may be separated for each speaker and one for the background/music stem. Speaker identities may be identified for each scene in a movie, and audio stems may be mapped to actor identities that may include multiple non-contiguous portions scattered throughout a movie or television show. Each speaker stem may be separated and have a dedicated volume level that is relative to other audio sources in the content. Listeners may interact with a user interface to increase or decrease the volume level for a single stem—for example, increasing the volume of one actor. When a listener increases the volume level of one speaker, the volume level of other speakers may also receive adjustments that are non-linear. In various embodiments, audio mean and variance of audio volume levels are measured among all speakers and listeners are able to set the volume of one speaker stem relative to other speaker stems. For example, if a movie has two actors speaking, if the first actor's volume is too loud, a listener would decrease the volume for the first actor. This may involve the user physically interacting with a remote control device, issuing a voice command, etc. The volume of the two actors may be decreased such that they are relatively closer together. In cases where the second actor is not speaking loudly enough for the listener to hear, the listener may increase the volume for the second actor and the volume levels for both actors may be adjusted so that they are relatively closer to each other. In yet another case, when a listener finds it hard to understand dialogs by a first actor even if they speak in a similar volume as a second speaker, the listener may wish to increase the volume of the first actor much louder than the second speaker.

In various embodiments, remote control or other audio control devices may be used to adjust volume levels in a non-linear fashion. Buttons of a conventional remote control (e.g., one that uniformly and linearly adjusts volume) may be overloaded or customized to perform techniques described herein. Buttons in remote controls may be used to increase/decrease the overall volume levels, thereby achieving the right levels that a listener desires. The volume defined by a listener is not necessarily a static value—variations in an actor's voice that result from different emotions and intonations may be accounted for so that the creative intent or expression of different audio segments may be preserved in the adjusted audio.

A multi-speaker volume equalization subsystem may be used to log customer preferences and compute means and variances of audio levels in audio content for a listener. Audio content may refer to podcasts, radio, and other audio-only sources, as well as television, movies, etc. that include both audio and video components. Speaker-specific volume level equalization may comprise a trained machine-learning model that predicts, for a user, the audio level preference for each speaker and background in audio content and automatically adjusts the volume for new audio content consumed by the user. Users may have the option to override the automatically adjusted volume levels using speaker-specific volume level equalization. Users' manual adjustments may be used to adjust the parameters of the trained machine-learning model and refine subsequent predictions generated by the machine-learning model as it learns the user's preferences.

A multi-speaker volume equalization subsystem may comprise multiple components, including but not limited to: speaker diarization component; background noise detection component; machine-learning model trained to predict and adjust speaker and background noise volume; multi-speaker volume adjustment component; and combinations thereof. Speaker diarization component may be used to separate audio into different stems (e.g., a distinct stem for each speaker and a background stem). Speaker identity may be determined based on various audio or visual information—for example, by using facial detection to match a speaker with an identity. Speaker diarization may be configured to handle multiple speakers on screen at a time and parse speech from a first speaker to a first stem and speech from a second speaker to a second stem. Background noise detection component may refer to a real-time model for separating background audio from speaker audio sources. Multi-speaker volume adjustment component may refer to a plugin that overloads or customizers the behavior of the volume up/down behavior. Users may set the desired volume for each speaker separately using multi-speaker volume adjustment component. Under the customized behavior, the remote control may use user configurations to adjust the volume of audio playback. Additional components may include, for example, a volume controller component that overloads or customizes the behavior of the volume up and/or volume down buttons on a remote control.

Once volume preferences are learned by the machine-learning model, the model may be used to automatically determine the amplitude of the signal in waveforms and may furthermore be used to adjust volume levels for each speaker without requiring manual input by the user. For example, an audio waveform may be adjusted to reduce the amplitude of loud music that is, in the audio source, several orders of magnitude greater than the volume of speakers immediately before, after, or even during the music, thereby resulting in a more comfortable listening experience for the user.

Various use cases may utilize speaker-specific volume level equalization. For example, speaker-specific volume level equalization may be used to process a piece of audio content (e.g., audio from a movie) so that the audio levels of different speakers or stems are adjusted separately from one another to produce overall volume levels that are less likely to require further adjustment from users. Speaker-specific volume level equalization may be used in audio localization of audio content (e.g., a movie) that is created in one language and being dubbed over to a second language. As part of this localization process, speaker-specific volume level equalization may be used to mix and generate audio content in the second language so that volume levels are less likely to require adjustment from users.

Speaker-specific volume level equalization may be used to generate new content based on metadata and information learned through speaker-specific volume level equalization that is performed on other audio content with characteristics in common. For example, speaker-specific volume level equalization may be performed on a first season of a television show to determine the optimal volume levels for various speakers in the television show may be used to determine baseline volume levels that may be used for mixing and mastering of audio content for the second season while it is in production. The use of preferred volume levels learned from the previous season may be used to determine baseline volume levels for future seasons of the same show, as it may share many common characteristics, including the actors, emotional states, interactions between background and voice stems, and more. Accordingly, speaker-specific volume level equalization may be used to aid in the creation of new audio content, in at least some embodiments.

The above descriptions are for purposes of illustration and are not meant to be limiting. Numerous other examples, configurations, processes, etc., may exist, some of which are described in greater detail below. Example embodiments will now be described with reference to the accompanying figures.

FIG. 1 illustrates a computing environment 100 in which speaker-specific volume level equalization may be practiced, in accordance with one or more example embodiments of the present disclosure. Techniques described in connection with FIGS. 2-8 may be implemented in the context of FIG. 1.

In various embodiments, multi-speaker volume equalization system 102 refers to hardware, software, or a combination thereof that adjusts the volume of audio content in a non-uniform manner. This may be due to the nature of audio content or how it is created. For example, a television show may have background music so loud that it drowns out foreground dialogue. In various embodiments, relative adjustments in volumes for different stems (e.g., representing audio speech from different actors) may be performed in the context of FIG. 1. In various embodiments, the audio track of audio-based content—which may include a video component—is separated into a plurality of stems based on speaker. In some cases, one or more additional stems are provided for background sounds, special effects, music, etc. In some cases, a predetermined number of stems are provided. When customers increase the volume level of one actor, the volume level of other actors may be adjusted in a non-uniform manner. Mean and variance information of the volume among all speakers may be determined. If a first speaker is too loud, the user may decrease the volume of the first speaker. The relative volume of the first speaker would be changed to be relatively closer to a second speaker, in some embodiments. In the case where a second speaker is not speaking loud enough for the user to hear, the user could increase the volume for the second speaker, and then the volume levels for the first and second actors may be adjusted to be relatively closer.

In some embodiments, a stem may correspond to a latent representation of one or more paralinguistic characteristics. For example, if two actors share a paralinguistic characteristics—for example, they both speak with a very deep voice—the user preferences may be shared between the two actors. Accordingly, if a user views a first movie and increases the volume for a first actor whose voice is determined to have or is correlated to a first paralinguistic characteristic, the target volume level for a second actor whose voice is also determined to have or is correlated to the first paralinguistic characteristic may be likewise increased. In some embodiments, a stem is associated with a paralinguistic characteristic such that all speakers that share the paralinguistic characteristic have their volume adjusted accordingly.

Display device 104 may be a television or other suitable display device that may be used to provide a graphical interface to the user. The user may interact with display device 104 to view and adjust stem-specific volume settings. In various embodiments, display device 104 provides a graphical interface to users that shows the volume mean/variance and stem volume levels. The graphical interface may be accessible to a user via a menu and a user may use a control device (e.g., remote control 106) to navigate through the menu and access the graphical interface. Stem volume levels may be displayed for some or all stems (e.g., separate volume levels for some or all actors). The display device 104 may be used to present information to the user that lets them adjust the volume according to their preferences. For example, for a movie, volume levels may be presented for the lead actors and perhaps even for supporting actors. In some cases, the graphical interface includes a slider that allows a user to select a volume level between 1 and 10 with 1 being softest, and 10 being loudest. In this way, the relative volume of different actors can be adjusted based on user preferences. In some embodiments, the display device 104 is used to play multimedia content, such as a movie, that includes both video and audio components. While multimedia content is discussed in the context of FIG. 1, various techniques are also applicable to audio-only content such as podcasts or audio files, which is made clear based on context. Display device 104 may include one or more speakers for audio playback or otherwise provide for cables, wires, or other physical connections that may be connected to external speakers for audio playback.

Remote control 106 is a portable device and is configured to provide the user with a means for interacting with the graphical interface. The remote control 106 may be a device with independent functionality, such as a smartphone, tablet computer, gaming device, and so forth, which is in communication with an audio playback device. In some implementations, the remote control 106 may also be configured to produce output such as visual, audible, haptic, and so forth. In some embodiments, a graphical interface that displays stem-specific volume settings may be shown directly on remote control 106, for example, via an LCD display integrated into remote control 106.

In at least one embodiment, multi-speaker volume equalization system performs speaker diarization and/or background noise separation 108. In some embodiments, audio content is parsed to identify one or more speaker stems and one or more background stems. Speaker stems may be associated with specific actors or persons that are speaking. Each speaker may be assigned an identity, which may correspond to a known individual (e.g., an actor's name), may be a sequence of random digits that represents an identity, and so forth. Audio content may be separated into turns, wherein each turn is a segment of audio that corresponds to a particular stem. For example, turns may be given when two speakers are exchanging a set of questions and answers. One or more background stems and/or noise separation may extracted from audio. In some embodiments, one background stem serves as a stem for any background audio that is not associated with a speaker. In some cases, multiple background stems may be used to differentiate between different types of non-speaker audio, such as special effects (e.g., explosions), music, and more. Having different background stems may be useful for adjusting the volume levels of different types of background sounds independently or, more generally, in a non-uniform manner.

Speaker diarization may be performed using video sources. For example, a multimedia content having both video and audio components may be analyzed by performing facial detection and facial recognition to identify the speaker's identity. The facial recognition system may include a repository of facial data for celebrities and other individuals that may be used to provide an identity to the speaker. In some embodiments, speakers may be first assigned a unique numerical identifier, and then the numeric identifier is replaced by an actor identity when the identity of the speaker is confirmed using video cues.

In at least one embodiment, multi-speaker volume equalization system extracts speaker contextual information 110. Extracting speaker contextual information may comprise analyzing audio and/or video to determine emotions and intonations of a speaker. Various audio characteristics and/or visual scene characteristics may be used to determine how audio adjustments should be made for a stem. For example, techniques that normalize all of a speaker's speech to the same baseline volume may fail to capture contextual information relating to the speech—conversely, techniques described herein may be used to make adjustments to stem volume by analyzing contextual information associated with the audio/speech, such as whether an actor is angry and demonstrative or sad and quiet. Based on the emotions detected for a speaker, the speech of the speaker may be set to different baseline volumes. As a first example, an actor's speech that is angry and demonstrative may be adjusted by a scaling factor of greater than 1.0 to account for the emotion context indicating the speech should be relatively louder than more neutral emotions. As a second example, an actor's speech that is sad or sullen may be adjusted by a scaling factor of less than 1.0 to account for the emotion context indicating the speech should be relatively softer than more neutral emotions. Emotions may be extracted as various data structures. In some cases, an emotion from a predetermined list of emotions is determined. In some cases, a confidence interval for one or more known emotions is determined on a scale of 0 to 1 wherein higher values correspond to higher confidence in a particular emotion. In some cases, an embedding vector is determined that encodes the similarity of the analyzed speech/video with various emotions.

In some cases, visual information may be used to determine an appropriate scaling factor. Frames and/or clips of video may be analyzed to determine whether they are associated with more or less active scenes, which may correlate with higher or lower volume levels, which may be used to adjust the scaling factor of the corresponding audio. Extracted information may include contextual information relating to who was speaking at the time a user adjusted volume up/down, absolute volume at the time of adjustment, relative volume between speakers at the time of adjustment, and so forth. This information may be persisted in a logging system, such as a database, which may be used for subsequent learning to refine non-uniform stem-specific volume adjustment.

In at least one embodiment, multi-speaker volume equalization system performs per-stem volume normalization 112. Per-stem volume normalization may adjust the volume levels of different stems in a non-uniform manner based on previous viewer preferences and feedback. A pre-trained machine-learning model may be used to predict the appropriate volume levels for each stem. For example, each audio stem may have an audio setting between 0 and 100 or between 0 and 10. A machine-learning model may receive, as inputs, user preference information, audio content information, and generate predicted volume levels for each stem. For example, on a scale between 0 and 100, a default volume level of 50 may indicate that no adjustments relative to the original audio content need to be made, whereas lower values indicate that the volume levels for the stem should be made softer and higher levels indicate that the volume levels should be increased. In some embodiments, information such as user configuration, previous viewing/listening history from watching multiple shows, user interaction history, etc., may form a history about user preference that can be used to train a machine-learning model to determine how to adjust the volume preferences for every given speaker.

In at least one embodiment, multi-speaker volume equalization system adjusts weights based on user feedback 114. In various embodiments, user feedback includes subsequent user interactions to adjust volume levels throughout playback of the audio content. For example, when a user presses the volume adjustment buttons on remote control 106, the increase, decrease, muting, etc. of the volume may be recorded as historical volume control commands and used for subsequent training and refining of the machine-learning weights. Contextual information of the audio content at the time that the user feedback was initiated may also be recorded. For example, timestamps of the audio may be recorded and mapped to a speaker, volume level, etc. that may be used to determine audio patterns which cause the user to make volume adjustments. For example, if the user frequently adjusts the volume for a particular speaker upward, the user may find it difficult to understand the speaker, even when that speaker's volume level is equally as loud as another speaker. Additionally, if the user frequently adjusts the volume downward when loud portions of audio are being played and re-adjusts the volume upward afterwards, it may indicate that the user is sensitive to louder portions of audio. In such cases, the standard deviation of the volume levels may be decreased to be in a narrower band, while still maintaining the same mean volume. Conversely, if the user frequently adjusts the volume upward in softer portions and then down afterwards, the standard deviation may likewise be decreased while maintaining the same mean volume.

Figure 2:
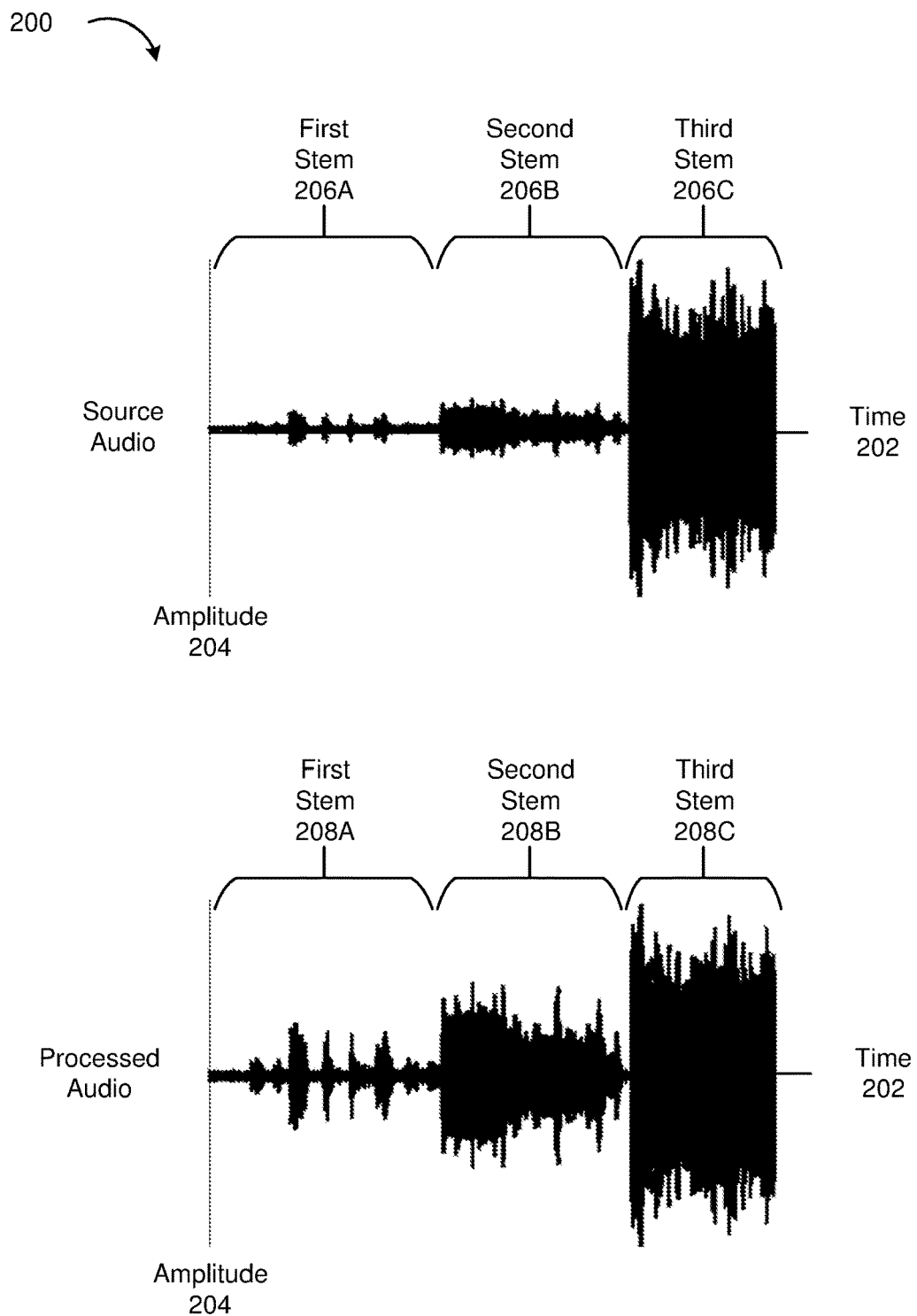
FIG. 2 illustrates an example diagram of source audio and processed audio with non-uniform stem volume adjustments, in accordance with one or more example embodiments of the present disclosure.

FIG. 2 illustrates an example diagram 200 of source audio and processed audio, in accordance with one or more example embodiments of the present disclosure. Techniques described in connection with FIG. 2 may be used to process source audio to generate processed audio having non-uniform volume adjustments to different stems based on user preferences.

In at least one embodiment, source audio and processed audio is plotted with audio amplitude 204 against time 202. Higher and lower amplitude values correspond to louder and quieter portions of audio, respectively. Source audio may be diarized and separated into a plurality of stems 206A-C. Greater or fewer numbers of stems may exist, in various embodiments. For example, first stem 206A may correspond to speech from a first speaker, second stem 206B may correspond to speech from a second speaker, and third stem 206C may correspond to a background or music stem. Volume mean and standard deviations may be computed for each stem. In some embodiments, stem audio is analyzed to determine speaker emotions and/or intonations, which may be used to scale audio to be louder or softer based on the emotion being conveyed.

Volume for stems 206A-C may be normalized to generate stems 208A-C of processed audio. In various embodiments, adjusting stem volume levels may comprise a step to obtain user preferences indicating per-stem volume preferences (e.g., on a scale of 1 to 10). Volume preferences may be presented to a user via a graphical interface prior to playback of audio or multimedia content. Adjustments to the volume preferences may be used to determine the relative volume average and/or standard deviation or other statistical measures of audio volume between stems. For example, in FIG. 2, it is depicted that background/music is played at a significantly higher volume than the preceding speech—the volume difference between stem 206B and 206C may, for example, be a difference of 15 decibels. A user may react unfavorably to such a large difference in volume and decrease the volume using a remote control. The user thereby decreases the target volume level. The remote control's volume down button may be customized to perform a non-uniform decrease in volume as between different stems 206A-C. The target volume level may be achieved by adjusting the volume the stems 208A-C while maintaining the standard deviation between respective stems. In various embodiments, audio playback is performed for audio-based content (e.g., multimedia content, streaming audio, streaming video) according to the non-uniform volume adjustments.

In various embodiments, non-uniform volume adjustment of audio content is performed by increasing the volume of stems 206A-C to preserve a difference in the standard deviation between the audio stems. This is in contrast to uniform volume adjustment wherein uniformly increasing the mean volume level of all stems also increases the difference in volume standard deviation between stems. With multi-stem volume equalization, the volume levels of each stem are adjusted non-uniformly and based on learned user preferences. For a given user configuration, the relative difference across multiple stems is known, such as the difference in mean volume and standard deviation of two stems for the user's given stem configurations. As is depicted in FIG. 2, the mean difference between stem 208B and 208C may be 4 decibels. The difference in processed audio is less than the difference in source audio (4 decibels vs. 15 decibels) which may provide for a more pleasant listening experience to users.

Figure 3:
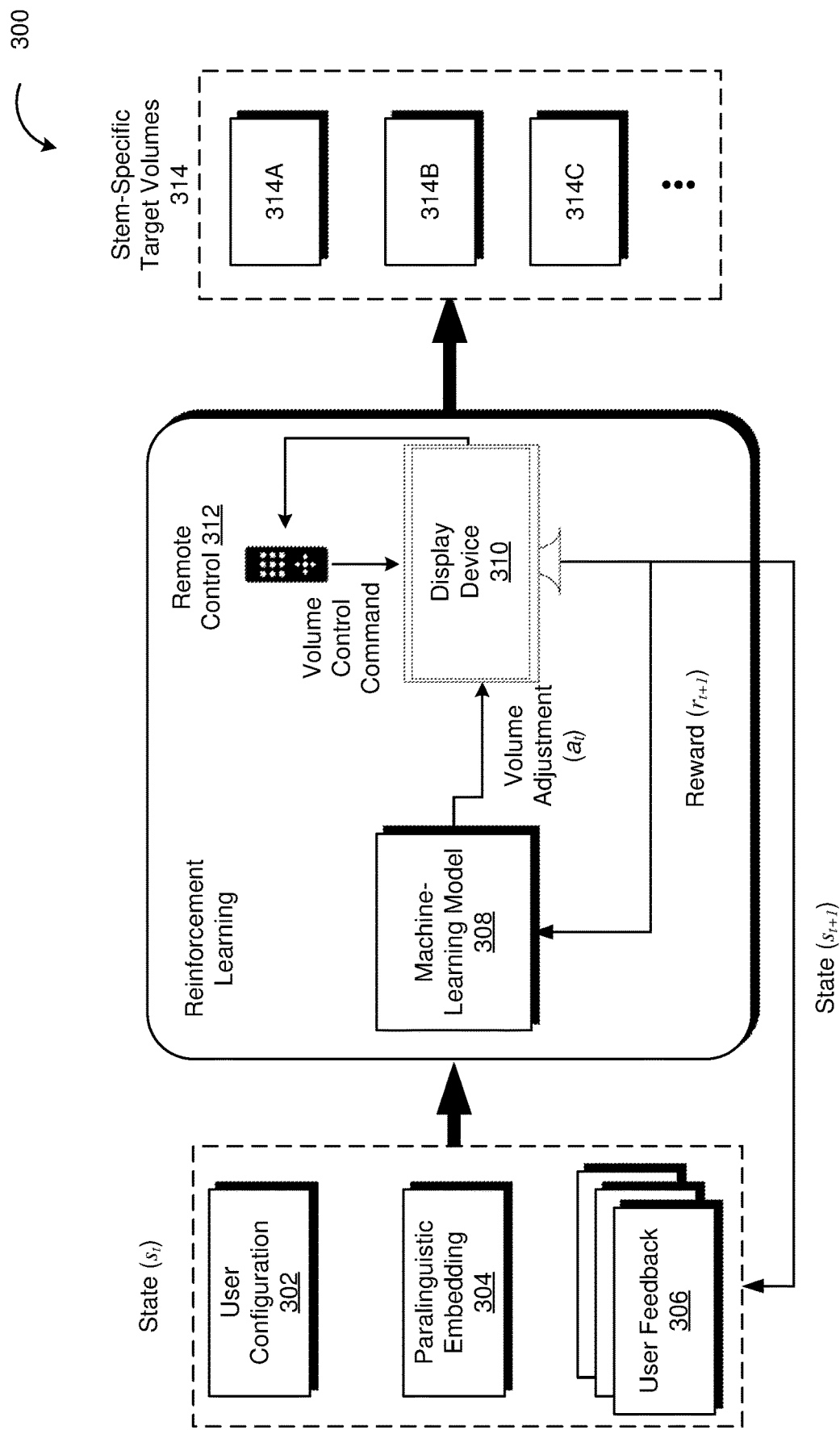
FIG. 3 illustrates an environment 300 depicting reinforcement learning for speaker-specific volume level equalization, in accordance with one or more example embodiments of the present disclosure.

FIG. 3 illustrates an environment 300 depicting reinforcement learning for speaker-specific volume level equalization, in accordance with one or more example embodiments of the present disclosure. Reinforcement learning may be utilized to refine the weights of a machine-learning model, such as those described in connection with FIGS. 1-2 and 4-8, in response to user feedback.

State information $s_t$ may refer to data values at a specific point in time t that may be used for reinforcement learning to adjust or update weights of a machine-learning model. A machine-learning model contemplated herein may refer to an artificial neural network such as a variational autoencoder (VAE), feedforward, non-current neural network, or other suitable machine-learning models for generating stem-specific target volumes 314. For example, A first stem may have a first target volume 314A that is adjusted non-uniformly (e.g., not one-to-one) as compared to a second target volume 314B for a second stem, third target volume 314C for a third stem, and so on. In various embodiments, state information $s_t$ comprises user configuration 302, paralinguistic embedding 304, and user feedback 306 at a certain point in time. User configuration 302 may refer to the audio configuration settings that a user has selected for various stems—for example, speaker-specific stems may be configured with volume settings between 1 and 10, with 1 being the softest and 10 being the loudest. Paralinguistic embedding may refer to an embedding vector that encodes semantics of paralinguistic information that is extracted from audio and/or video. Paralinguistic information may refer to information that may be used to modify meaning, give nuanced meaning, or convey emotion. Paralinguistic information may be determined based on nonphonemic properties of speech such as prosody, pitch, volume, intonation, etc. User feedback 306 may refer to historical volume control commands and the contexts in which such commands were issued.

State information $s_t$ may collectively be used to perform reinforcement learning. A reinforcement learning process may involve a machine-learning model 308 generating predictions for a set of target volume levels for a plurality of stems. The machine-learning model may, accordingly, cause the volume levels of the stems to be adjusted according to their respective target volume levels. In this sense, the machine-learning model may be considered an agent or a component of an agent system. Volume control commands to adjust the volume on display device 310 may be considered actions. Further, volume control commands issued by a user (e.g., via remote control 312 may also be considered actions. The environment of the reinforcement learning may include the display device 312.

As part of reinforcement learning, rewards may be provided in response to actions. It should be noted that doing nothing (e.g., maintaining the current volume level) may be considered an action in the context of reinforcement learning. An action $a_t$ may be selected based on state information $s_t$ at time t. A reward $r_t$ may be determined based on $a_t$. Furthermore, the state of the system may be updated to a new state $s_{t+1}$ based on the action $a_t$ performed. If the action results in a response by the user (e.g., user performs a volume control command using the remote control 312), then the reward $r_t$ may be negative. However, if the user does not manually re-adjust the volume, then the reward $r_t$ may be positive. The reinforcement learning agent (e.g., machine-learning model 308) may be trained to maximize its overall reward over time.

In some embodiments, a generative adversarial network (GAN) is used to improve the audio quality of stem-specific target volumes 314. A GAN/VAE may be used to generate processed audio using stem-specific target volumes 314. The processed audio may be passed to a GAN discriminator to determine how realistic the processed audio is and the discriminator may attempt to determine whether the input audio was processed or not. The original audio may be used as ground truth data to train such a GAN. The machine-learning model weights may be updated based on the output of the GAN to make it more difficult to discriminate between original audio inputs and processed audio inputs generated by the machine-learning model.

Figure 4:
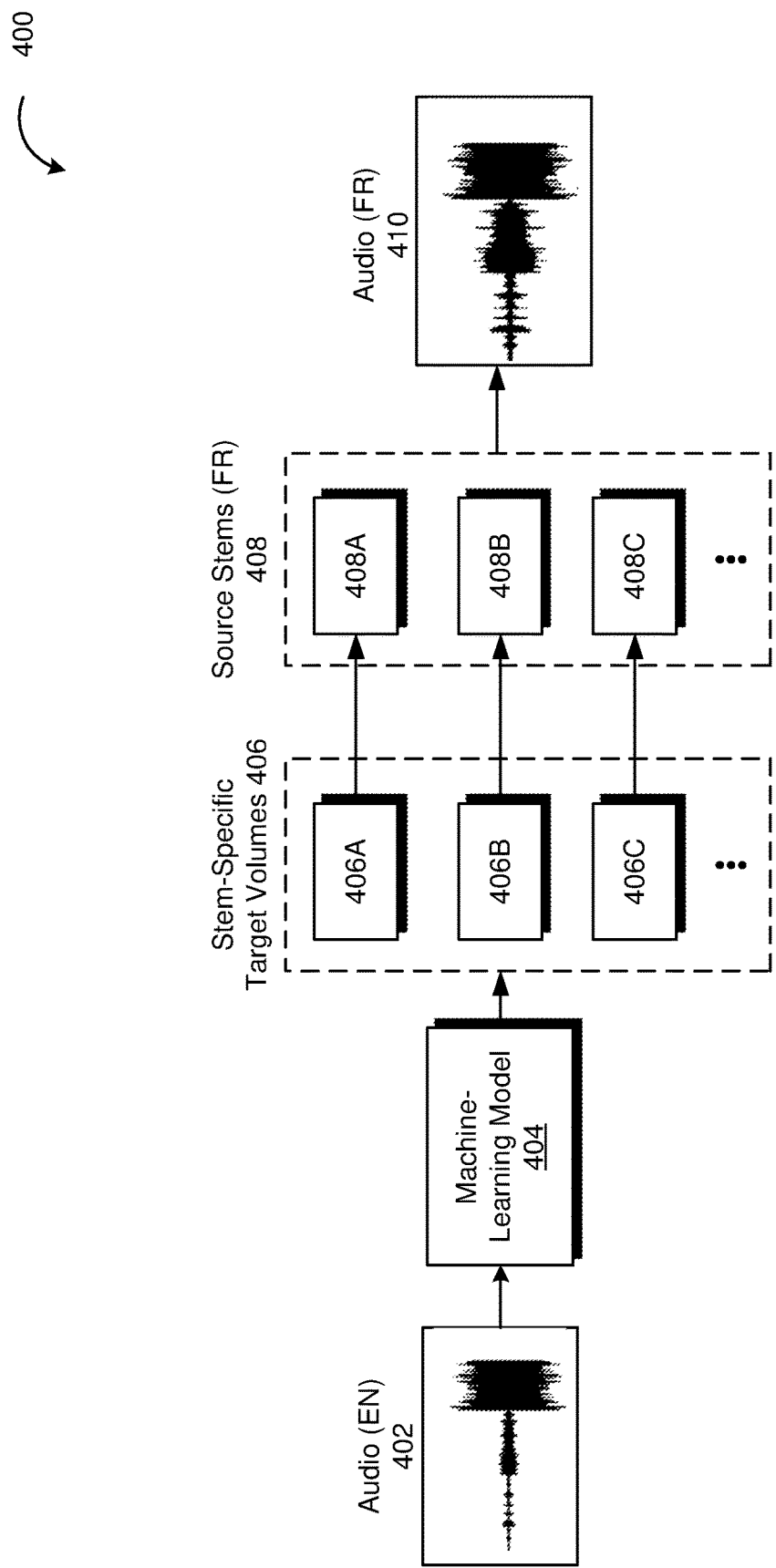
FIG. 4 illustrates an environment for using speaker-specific volume level equalization that may be used in localization of audio content, in accordance with one or more example embodiments of the present disclosure.

FIG. 4 illustrates an environment 400 for using speaker-specific volume level equalization that may be used in localization of audio content, in accordance with one or more example embodiments of the present disclosure. FIG. 4 depicts a first audio (EN) 402 that corresponds, for example, to a television show or movie that is in English (EN). The content may have been originally released in English with an English-speaking cast of actors and so forth. As part of localizing (e.g., dubbing) the content to a different language, the audio may be processed using speaker-specific volume level equalization techniques described herein. For example, first audio (EN) 402 may be diarized to identify a plurality of stems. A machine-learning model 404 such as those described in connection with FIG. 3 may be used to generate stem-specific target volumes 406 which may be used to determine the relative volume difference between each stem. When the content is being dubbed to a second language, such as French, the French content may be originally recorded into different stems—for example, first French actor records first stem 408A separately from second French actor recording second stem 408B and so forth. Each of these stems 408A-C may have their volume levels adjusted to match their respective stem-specific target volumes 406. Once each of stems 408A-C have been processed, they may be combined to produce an output audio (FR) 410.

Figure 5:
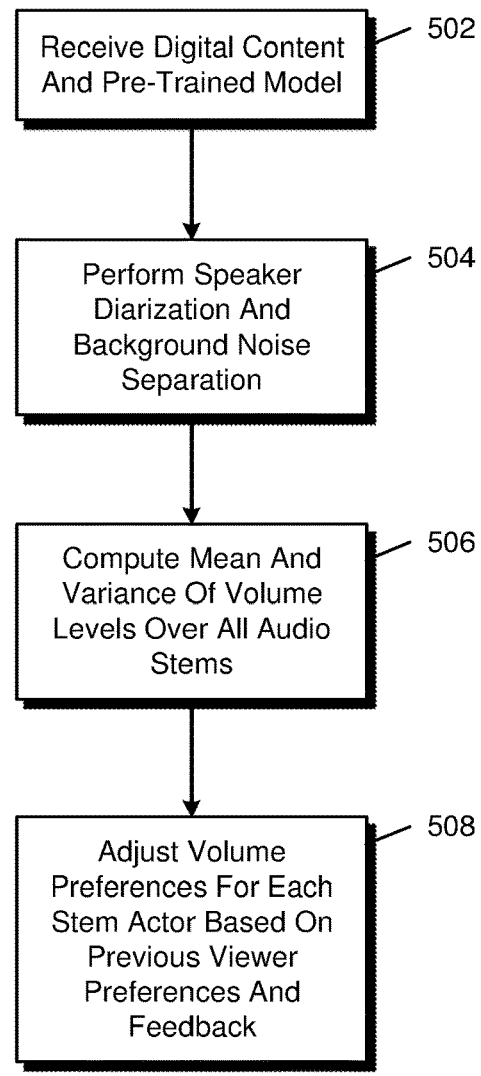
FIG. 5 shows an illustrative example of a process for speaker-specific volume level equalization, in accordance with one or more example embodiments of the present disclosure.

FIG. 5 shows an illustrative example of a process 500 for speaker-specific volume level equalization, in accordance with one or more example embodiments of the present disclosure. In at least one embodiment, some or all of the process 500 (or any other processes described herein, or variations and/or combinations thereof) is performed under the control of one or more computer systems that store computer-executable instructions and may be implemented as code (e.g., computer-executable instructions, one or more computer programs, or one or more applications) executing collectively on one or more processors, by hardware, software, or combinations thereof. The code, in at least one embodiment, is stored on a computer-readable storage medium in the form of a computer program comprising a plurality of computer-readable instructions executable by one or more processors. The computer-readable storage medium, in at least one embodiment, is a non-transitory computer-readable medium. In at least one embodiment, at least some of the computer-readable instructions usable to perform the process 500 are not stored solely using transitory signals (e.g., a propagating transient electric or electromagnetic transmission). A non-transitory computer-readable medium does not necessarily include non-transitory data storage circuitry (e.g., buffers, caches, and queues) within transceivers of transitory signals. Process 500 may be implemented in the context of various systems and methods described elsewhere in this disclosure, such as those discussed in connection with FIGS. 1 and 8. In at least one embodiment, process 500 or a portion thereof is implemented by a computing resource service provider. Process 502 may comprise an initial step to receive 502 digital content and pre-trained model. In some embodiments, the model is trained based on the digital content alone, whereas in other embodiments the model may be trained based on a range of different digital contents.

In at least one embodiment, process 500 comprises a step to perform 504 speaker diarization and background noise separation. In some embodiments, audio content is parsed to identify one or more speaker stems and one or more background stems. Speaker stems may be associated with specific actors or persons that are speaking. Each speaker may be assigned an identity, which may correspond to a known individual (e.g., an actor's name), may be a sequence of random digits that represents an identity, and so forth. Audio content may be separated into turns, wherein each turn is a segment of audio that corresponds to a particular stem. For example, turns may be given when two speakers are exchanging a set of questions and answers. One or more background stems and/or noise separation may extracted from audio. In some embodiments, one background stem serves as a stem for any background audio that is not associated with a speaker. In some cases, multiple background stems may be used to differentiate between different types of non-speaker audio, such as special effects (e.g., explosions), music, and more. Having different background stems may be useful for adjusting the volume levels of different types of background sounds independently or, more generally, in a non-uniform manner.

Speaker diarization may be performed using video sources. For example, a multimedia content having both video and audio components may be used to assign different turns to different speakers by relying on video to perform facial detection and facial recognition to identify the speaker's identity. For example, if a video segment includes a clear shot of an individual's face with lips moving, it may be a clear indicator that the individual is speaking, and that the speaker stem can be assigned to that individual. A patch of a video frame with the face may be extracted and provided to a facial recognition system to determine who the speaker is. The facial recognition system may include a repository of facial data for celebrities and other individuals that may be used to provide an identity to the speaker. In some embodiments, speakers may be first assigned a unique numerical identifier, and then the numeric identifier is replaced by an actor identity when the identity of the speaker is confirmed using video cues.

In some embodiments, a voice recognition system is used to match the audio waveforms of a speaker to those of known actors or other individuals for whom their voice and speech patterns may be known. The cadence, inflection, and other properties of speech may be used to determine speaker identity information. This may be used in cases where video content is unavailable (e.g., for an audio podcast), but is not necessarily limited in such a manner. In some cases, speaker information may include metadata. For example, for various types of media, a list of all speakers within a television show or movie may be provided in metadata or otherwise known. A machine-learning model may be used to identify speakers based on speech or video or other components by generating embedding vectors based on the audio and/or visual content and compared against a list of embedding vectors associated with each of the actors or individuals in the show. The cosine distance between embedding vectors may be used to determine the identity of the speaker.

In at least one embodiment, process 500 comprises a step to compute 506 mean and variance of volume levels over all audio stems. As discussed above speaker diarization techniques may be used to separate audio into N+1 stems, wherein each of the N stems corresponds to a speaker or speaker identity, and an additional stem corresponds to a background/non-speaker stem. In various embodiments, the volume level for each speaker, relative volume between speakers and music/background, etc. is analyzed. Computations of per-stem mean and variance of volume levels over the entire audio content or suitable portions thereof. In some cases, mean and/or variance of volume levels are scaled relative to a scaling factor. Scaling factor may be determined based on an evaluation of the emotion being presented by the user. For example, the scaling factor may be higher for when a speaker's emotion is determined to be more animated or energetic, and the scaling factor may be lower when a speaker is being more pensive or sneaky. In this way, it may be possible to determine whether a particular first actor is speaking louder or softer relative to another actor, while also accounting for contextual information relating to the emotional context of the actors' speech.

In various embodiments, a graphical interface is provided to users that shows the volume mean/variance and stem volume levels. The graphical interface may be accessible to a user via a menu and a user may use a control device (e.g., remote control) to navigate through the menu and access the graphical interface. Stem volume levels may be displayed for some or all stems (e.g., separate volume levels for some or all actors). The graphical interface may be used to present information to the user that lets them adjust the volume according to their preferences. For example, for a movie, volume levels may be presented for the lead actors and some supporting actors. In some cases, the graphical interface includes a slider that allows a user to select a volume level between 1 and 10 with 1 being softest, and 10 being loudest. In this way, the relative volume of different actors can be adjusted based on user preferences.

In some embodiments, a graphical interface is presented to the user prior to presentation of audio/video content, for example, at a preview screen or an audio configuration setting accessible via such a preview screen so that a user may configure audio settings per stem at the beginning of the show. Speaker diarization and audio level computations may be performed prior to a user viewing audio content, so that per-stem audio settings may be presented to allow users to adjust per-stem volume levels.

In at least one embodiment, process 500 comprises a step to adjust 508 volume preferences for each stem (e.g., actor stems) actor based on previous viewer preferences and feedback. A pre-trained machine-learning model may be used to predict the appropriate volume levels for each stem. For example, each audio stem may have an audio setting between 0 and 100 or between 0 and 10. A machine-learning model may receive, as inputs, user preference information, audio content information, and generate predicted volume levels for each stem. For example, on a scale between 0 and 100, a default volume level of 50 may indicate that no adjustments relative to the original audio content need to be made, whereas lower values indicate that the volume levels for the stem should be made softer and higher levels indicate that the volume levels should be increased. In some embodiments, information such as user configuration, previous viewing/listening history from watching multiple shows, user interaction history, etc., may form a history about user preference that can be used to train a machine-learning model to determine how to adjust the volume preferences for every given speaker.

Individual stem volumes may be adjusted relative to the mean variance. A user can adjust the overall volume, actor volume, etc. and these adjustments are logged as historical information (e.g., historical volume control commands) that can be used to learn user preferences and improve the accuracy of predictions generated by the model.

Initially, user preferences may be set to preconfigured values. For example, a neutral volume setting of 50 out of 100 may be set as a default for all stems, which may provide for a neutral listening experience relative to an audio source. In some cases, the preconfigured value is set based on aggregate viewer preferences learned from other viewers. For example, if a first user has not yet viewed a movie, but other users have adjusted the stem volume for a particular actor downward, the preconfigured value may be lower than 50 out of 100 based on historical aggregate user feedback, which may include historical volume control commands issued by the user. User preferences are logged, the way they interact with the remote is logged, the speaker or actor identifier are logged, and as well as other contextual information relating to per-stem volume adjustment may be logged for the user. When a user watches another movie or show, any suitable speaker configuration may be selected, and the historical volume control commands may be used to adjust those baseline volume configurations.

In various embodiments, process 500 comprises a step to override 508 remote control volume button behavior. For convention remote controls, a volume control button may be used to uniformly increase or decrease the volume. Uniform changes in volume across stems result in no relative change in volume between stems. In contrast, FIG. 5 depicts that a remote control behavior override wherein overriding the behavior of the remote control volume buttons causes a non-uniform change to the relative volume levels of different stems based on contextual information. For example, if a user increases the volume by pressing the volume up button on a remote control or issues a voice command to increase the volume on a show, it will increase the mean volume in a non-uniform manner such that it also increases the volume of the other actors relative to the actor on screen. Accordingly, overriding a command to increase volume causes a non-uniform adjustment in volume across each stem such that the mean volume across all stems is increased, but may be increased non-unfirmly based on contextual information of the content being played—for example, if a first actor corresponding to a first stem is speaking when volume is to be increased, the volume of the first stem may be increased by a first amount, whereas one or more other stems are adjusted by a second amount that is different from the first amount that results in an increased in the overall mean of the volume level. In some cases, the second amount may be less than the first amount, resulting in an overall increase in volume for the adjusted audio content.

In various embodiments, non-uniform volume adjustment of audio content is performed by increasing the volume of two audio stems to preserve a difference in the standard deviation between the two audio stems. This is in contrast to uniform volume adjustment wherein uniformly increasing the mean volume level of all stems also increases the difference in volume standard deviation between stems. With multi-stem volume equalization, the volume levels of each stem are adjusted non-uniformly and based on learned user preferences. For a given user configuration, the relative difference across multiple stems is known, such as the difference in mean volume and standard deviation of two stems for the user's given stem configurations. In various embodiments, the volume control inspects the user configurations and adjusts according to audio preference information learned from the user. For example, if the user sets the volume between two actors on screen with a difference of 1.0 standard deviations, then the difference in standard deviation may be maintained.

As an example, consider a movie or other multimedia content in which a scene includes a first person talking with a second person. Similarly, a podcast or other audio-only content with a first person talking with a second person may be considered. Regardless, the audio for such content may be diarized and segmented into multiple stems, as discussed above. Each stem may correspond to a speaker—in this example, a first stem may correspond to speech utterances from the first person, a second stem may correspond to speech utterances from the second person, a third stem may correspond to third person that speaks later on, a fourth stem for background sounds, and so forth. To avoid surprises, if the user wants to increase everybody's volume using the remote control, it may be increased non-uniformly so that the user does not encounter awkward cases where they hear a first person speaking very low and then someone else comes and shouts at very high volume, which would be annoying for the viewer. Non-uniform volume equalization may be used to normalize different stems so that it is not that different between the two.

For example, if a first speaker's volume, who is otherwise speaking low is increased, the system increase that person's volume and at the same time B's volume slightly comes down, relatively. The system ensures that if the first speaker's volume is greater than the second speaker's volume, that the adjusted first speaker's volume is still greater—in absolute terms—than the second speaker's volume, although the difference may be decreased relative to each other. By ensuring the absolute difference between two speakers does not change from one speaker being louder than the other to vice versa, the creative performance or intent of the audio content is preserved. Similarly, if a first speaker or stem's volume is too high and a second speaker is adjusted, everyone in the content and the background is adjust to be smoother to the user's listening experience. Once this setting is done from the regular remote control volume buttons, the levels can be adjusted so that all audio for a stem or across all stems is brought up or down to the user preference level.

By performing relative volume control, the users may experience a more pleasant listening experience. In various embodiments, relative difference between two stems is maintained when a user issues commands to increase or decrease audio volume. In various embodiments, non-uniform volume level equalization increases or decreases mean volume across all volumes so that the overall volume levels fall within a band or range of volumes. Anomalies—portions of audio that are exceptionally high or low—are avoided. For example, the standard deviation for all stems may be configured to fall within a predetermined range. Various statistical measures may be used to define a range of values in which stem volumes should fall within. In some cases, in embodiments, the system is configured such that all audio falls within the range. Stem volume levels may be adjusted so that each stem falls within a specific range of the desired overall mean volume, for example, within 1.0 or 2.0 standard deviations. In some embodiments, statistical measures are used to allow for a small portion (e.g., 5% or less) of the audio to exceed the specified range. Other techniques to reduce the variance of audio between stems for a target mean volume may be used. It may be acceptable for brief portions of audio to exceed the desired bands or ranges—for example, in a horror movie, it may be expected that there are portions of brief but loud audio that are used for dramatic effect. However, prolonged durations of loud audio may be unpleasant for a user. The allowance for exceeding the desired band or ranges may be a value of time, percentage of time, etc. The allowance may be defined as a predetermined value, as a value inferred through machine learning, or any other suitable manner.

For example, a user may access audio or multimedia content and issue a volume control command to increase volume. The volume control command may be a physical command issued by pressing a button on a remote control, a voice command issued to a personal smart assistant, and so forth. Volume adjustment commands may be overridden or overloaded by a multi-speaker volume adjustment component, for example, as described above in connection with FIG. 1. The volume adjustment command may be routed to multi-speaker volume adjustment component, which adjusts the average volume up or down to a target mean volume while ensuring the standard deviations of the loud parts and soft parts do not exceed a certain threshold. The threshold may be based on the current difference between stems, such as between a first stem and a second stem, or may be the difference between a stem and a collection of stems, such as all audio stems. In some embodiments, the threshold is a predetermined value.

In some embodiments, average volume is maintained in a second layer of adjusting audio stem level volumes, so the average remains the same. In some embodiments, a target standard deviation is maintained the same by increasing a first stem's average volume and decreasing a second stem's average volume. Maintaining the standard deviation may be used to ensure that portions of audio are not too loud or too soft in response to commands to increase or decrease the content's volume level. In this way, the average volume may be increased or decreased (e.g., uniformly, upon adjustment for target standard deviation), in a manner that maintains the standard deviation between stems.

Accordingly, automatic adjusting stem volume levels may comprise a step to obtain user preferences indicating per-stem volume preferences (e.g., on a scale of 1 to 10). Volume preferences may be presented to a user via a graphical interface prior to playback of audio or multimedia content. Adjustments to the volume preferences may be used to determine the relative volume average and/or standard deviation or other statistical measures of audio volume between stems. Automatic adjusting stem volume levels may comprise a step to determine a target volume level. The target volume level may be an average volume level as specified by the user, as a default volume level, and so forth. The target volume level may be achieved by adjusting the volume the various stems while maintaining the standard deviation between respective stems. In various embodiments, audio playback is performed for audio-based content (e.g., multimedia content, streaming audio, streaming video) according to the non-uniform volume adjustments.

Users may adjust per-stem volume levels, overall volume levels, and so forth. In various embodiments, user actions to adjust volume levels may be performed in relative and/or absolute terms. Techniques such as those discussed in connection with FIG. 6 may be used to learn user preferences and further refine how stem volume levels are adjusted according to process 500.

Figure 6:
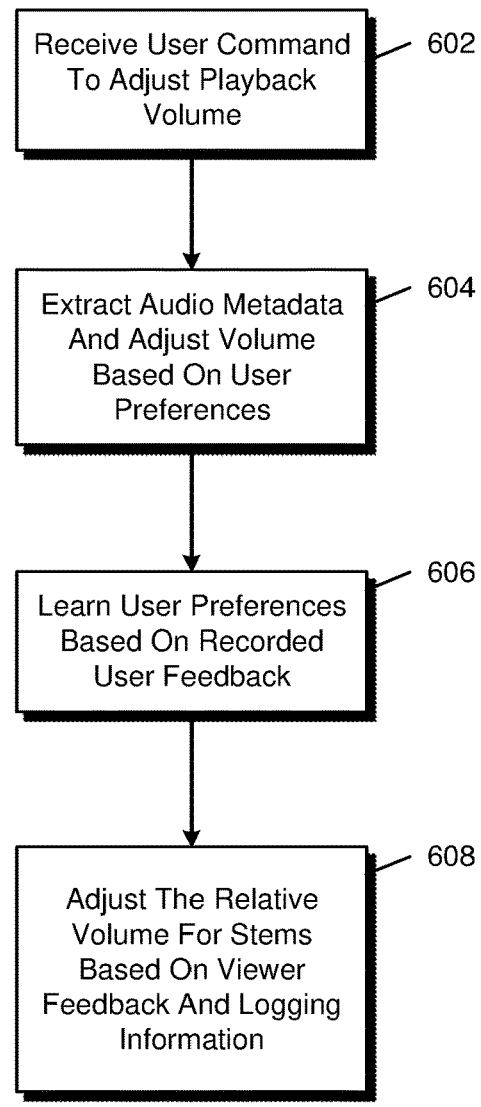
FIG. 6 shows an illustrative example of a process for learning user preferences for speaker-specific volume level equalization, in accordance with one or more example embodiments of the present disclosure.

FIG. 6 shows an illustrative example of a process 600 for learning user preferences for speaker-specific volume level equalization, in accordance with one or more example embodiments of the present disclosure. In at least one embodiment, some or all of the process 600 (or any other processes described herein, or variations and/or combinations thereof) is performed under the control of one or more computer systems that store computer-executable instructions and may be implemented as code (e.g., computer-executable instructions, one or more computer programs, or one or more applications) executing collectively on one or more processors, by hardware, software, or combinations thereof. The code, in at least one embodiment, is stored on a computer-readable storage medium in the form of a computer program comprising a plurality of computer-readable instructions executable by one or more processors. The computer-readable storage medium, in at least one embodiment, is a non-transitory computer-readable medium. In at least one embodiment, at least some of the computer-readable instructions usable to perform the process 600 are not stored solely using transitory signals (e.g., a propagating transient electric or electromagnetic transmission). A non-transitory computer-readable medium does not necessarily include non-transitory data storage circuitry (e.g., buffers, caches, and queues) within transceivers of transitory signals. Process 600 may be implemented in the context of various systems and methods described elsewhere in this disclosure, such as those discussed in connection with FIGS. 1 and 8. In at least one embodiment, process 600 or a portion thereof is implemented by a computing resource service provider.

In various embodiments, a user may initiate playback of audio-based content (e.g., multimedia content, streaming audio, streaming video). The content may be separated into different stems via speaker diarization and/or background noise separation steps. A multi-speaker volume adjustment component may be used to override the default behavior of various volume control commands, such as the behavior of a remote control's volume up/down buttons. The default behavior of such buttons may be to uniformly increase or decrease the volume of all audio content. Overriding the behavior of volume control commands may cause non-uniform adjustments to volume levels across different stems.

In at least one embodiment, process 600 comprises a step to receive 602 a user command to adjust playback volume. The user command may be logged and used to subsequently train a machine-learning model. The user command may be issued in any suitable form, for example, as a touch-based command issued by the user interacting with a touchscreen, as a physical command issued by the user pressing a physical button on a remote control device, as a voice command issued by the user speaking a wake word that is processed by a personal smart assistant software/hardware, and so forth. Users' volume control commands to adjust playback volume may be recorded and aggregated as training data to be used as historical volume control commands. In at least one embodiment, process 600 comprises a step to extract 604 audio metadata and adjust volume based on user preferences. This step may involve analyzing speech patterns to determine emotions and intonations of human speech. Various audio characteristics and/or visual scene characteristics may be used to determine how audio adjustments should be made for a stem. For example, techniques that normalize all of a speaker's speech to the same baseline volume may fail to capture contextual information relating to the speech—conversely, techniques described herein may be used to make adjustments to stem volume by analyzing contextual information associated with the audio/speech, such as whether an actor is angry and demonstrative or sad and quiet. Based on the emotions detected for a speaker, the speech of the speaker may be set to different baseline volumes. As a first example, an actor's speech that is angry and demonstrative may be adjusted by a scaling factor of greater than 1.0 to account for the emotion context indicating the speech should be relatively louder than more neutral emotions. As a second example, an actor's speech that is sad or sullen may be adjusted by a scaling factor of less than 1.0 to account for the emotion context indicating the speech should be relatively softer than more neutral emotions. In some cases, visual information—for example, frames of a movie—may be used to determine an appropriate scaling factor. Frames and/or clips of video may be analyzed to determine whether they are associated with more or less active scenes, which may correlate with higher or lower volume levels, which may be used to adjust the scaling factor of the corresponding audio. Extracted information may include contextual information relating to who was speaking at the time a user adjusted volume up/down, absolute volume at the time of adjustment, relative volume between speakers at the time of adjustment, and so forth. This information may be persisted in a logging system, such as a database, which may be used for subsequent learning to refine non-uniform stem-specific volume adjustment.

Steps 602-604 may be repeated for one or more audio contents. For example, user feedback may be recorded over the course of a movie, a TV show, or several different media. As more information is collected from an individual user's listening preferences and/or collectively various populations of users, a machine-learning model may be trained to more accurately tune the volume levels of each stem to reduce the amount of volume adjustments a user makes for various audio content, including audio content that a user listens to for the very first time.

In at least one embodiment, process 600 comprises a step to learn 606 user preferences based on recorded user feedback. In various embodiments, a machine-learning model for non-uniform stem-specific volume adjustment is trained based on user feedback. In various embodiments, training of a machine-learning model for non-uniform stem-specific volume adjustments is performed by collecting user feedback information over a period of time and performing training of the machine-learning model based on the collected user feedback information.

At any suitable point in time, a machine-learning model may be trained to perform non-uniform stem-specific volume adjustments. For example, prior to release of audio-based content, the content may be produced with multiple different predefined volume configurations—soft, medium, loud, for example—and have users select a predefined level for what they wanted to watch the show. Extracting user preferences, metadata about audio content, and other contextual information may be provided as inputs into a pre-trained model. Once a user listens to an audio clip or watches a particular digital multimedia content of a certain show, information regarding the user's listening habits may be recorded. Information about the content—such as speaker recognition information, facial detection information, etc. may be cached prior to the user consuming the content as a pre-processing step to reduce the amount of computing resources utilized in the processing stage.

In various embodiments, a machine-learning model is an artificial neural network, such as a variational autoencoder (VAE), feedforward, non-recurrent neural network, or other suitable machine-learning model for generating volume level inferences based on user feedback and content metadata. User feedback used to train the machine-learning model may include, without limitation: user interactions with remote control devices, user configurations, and whether user likes certain emotions and/or at a certain volume. User feedback may be associated with timestamps of audio content to correlate user feedback with content being played, such as scene information of a movie, speaker information, speaker volume, speaker emotion, and so forth. The machine-learning model may be trained to predict speaker or stem-specific volume means and/or standard deviations that are less likely to cause user feedback. Weights for the machine-learning model may be tuned during the training process and provided as an output of the training. This pre-trained model may then be used in some embodiments of process 600 to adjust 608 the relative volume for stems based on viewer feedback and logging information.

One or more operations of the methods, process flows, or use cases of FIGS. 1-8 may have been described above as being performed by a user device, or more specifically, by one or more program module(s), applications, or the like executing on a device. It should be appreciated, however, that any of the operations of the methods, process flows, or use cases of FIGS. 1-8 may be performed, at least in part, in a distributed manner by one or more other devices, or more specifically, by one or more program module(s), applications, or the like executing on such devices. In addition, it should be appreciated that processing performed in response to execution of computer-executable instructions provided as part of an application, program module, or the like may be interchangeably described herein as being performed by the application or the program module itself or by a device on which the application, program module, or the like is executing. While the operations of the methods, process flows, or use cases of FIGS. 1-8 may be described in the context of the illustrative devices, it should be appreciated that such operations may be implemented in connection with numerous other device configurations.

The operations described and depicted in the illustrative methods, process flows, and use cases of FIGS. 1-8 may be carried out or performed in any suitable order, such as the depicted orders, as desired in various example embodiments of the disclosure. Additionally, in certain example embodiments, at least a portion of the operations may be carried out in parallel. Furthermore, in certain example embodiments, less, more, or different operations than those depicted in FIGS. 1-8 may be performed.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Certain aspects of the disclosure are described above with reference to block and flow diagrams of systems, methods, apparatuses, and/or computer program products according to example embodiments. It will be understood that one or more blocks of the block diagrams and flow diagrams, and combinations of blocks in the block diagrams and the flow diagrams, respectively, may be implemented by execution of computer-executable program instructions. Likewise, some blocks of the block diagrams and flow diagrams may not necessarily need to be performed in the order presented, or may not necessarily need to be performed at all, according to some embodiments. Further, additional components and/or operations beyond those depicted in blocks of the block and/or flow diagrams may be present in certain embodiments.

Accordingly, blocks of the block diagrams and flow diagrams support combinations of means for performing the specified functions, combinations of elements or steps for performing the specified functions, and program instruction means for performing the specified functions. It will also be understood that each block of the block diagrams and flow diagrams, and combinations of blocks in the block diagrams and flow diagrams, may be implemented by special-purpose, hardware-based computer systems that perform the specified functions, elements or steps, or combinations of special-purpose hardware and computer instructions.

The examples presented herein are not meant to be limiting.

Figure 7:
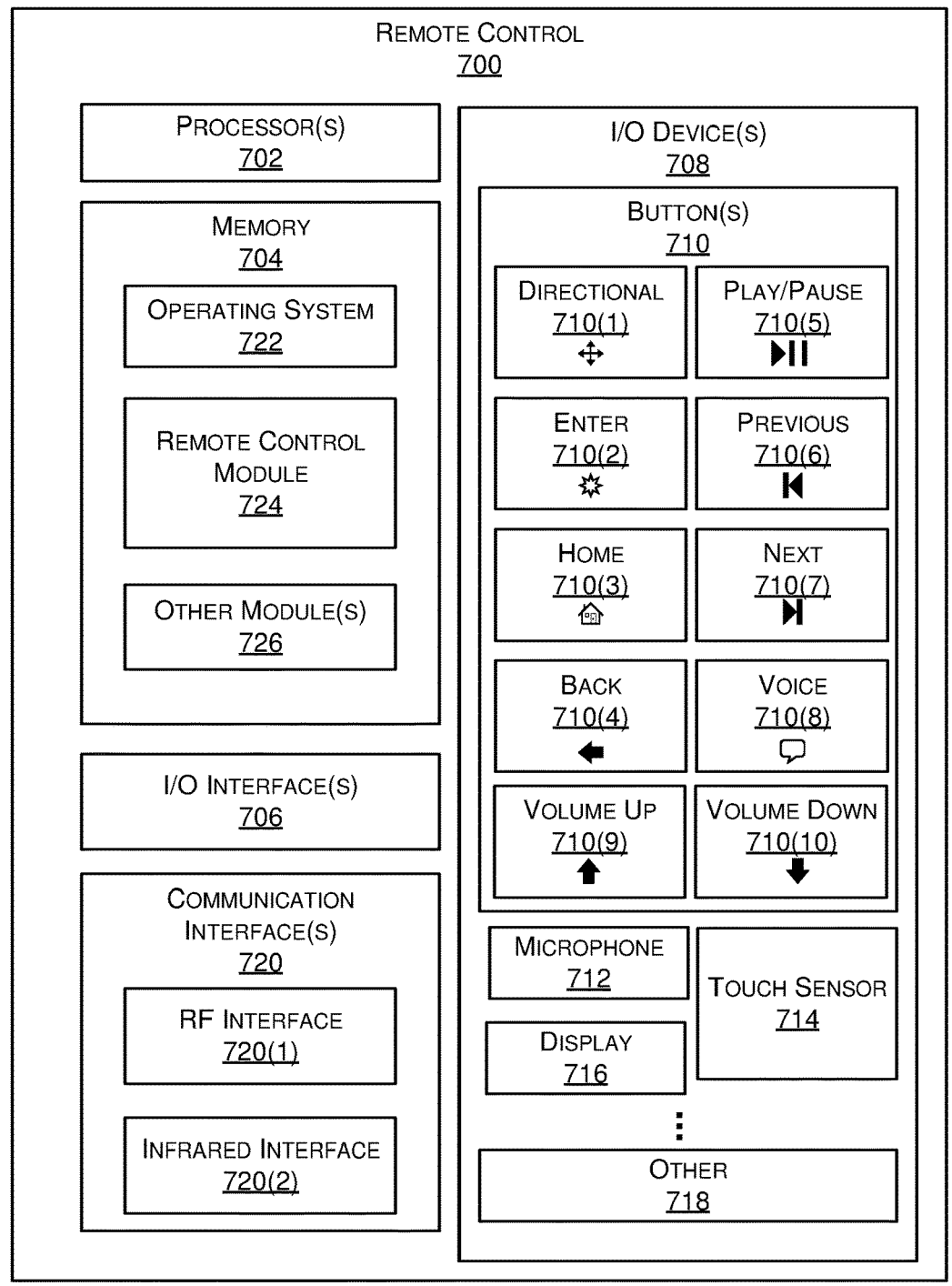
FIG. 7 illustrates a block diagram of a remote control configured to facilitate user interaction, according to at least one embodiment of the present disclosure.

FIG. 7 illustrates a block diagram of a remote control 700 configured to facilitate user interaction. Remote control 700 may be implemented in the context of various environments, such as those described in connection with FIG. 1. As described above, the remote control 700 is a portable device and is configured to provide user input to control audio-based content, such as podcasts, movies, television shows, live streaming events, and so forth. The remote control 700 may be a device with independent functionality, such as a smartphone, tablet computer, gaming device, and so forth, which is in communication with an audio playback device. In some implementations, the remote control 700 may also be configured to produce output such as visual, audible, haptic, and so forth. In some embodiments, a graphical interface that displays stem-specific volume settings may be shown directly on remote control 700, for example, via an LCD display integrated into remote control 700.

Remote control 700 may comprise one or more processors 702, one or more memories 704, one or more I/O interfaces 706, and one or more I/O devices 708. The I/O devices 708 may include one or more buttons 710, touch sensors microphones 712, touch sensors 714, displays 716, and other I/O devices 718. The other I/O devices 718 may include, accelerometers, gyroscopes, light sensors, haptic output devices configured to provide a vibrotactile output, speakers, digital light projectors, and so forth.

The buttons 710 may be hard keys or soft keys. The buttons may include one or more directional buttons 710(1). The directional buttons 710(1) may allow the user to navigate through a graphical interface, for example, by pressing the up, down, left, right, diagonally, and so forth to navigate through menus, settings, preferences, and so forth. An enter button 710(2) may be provided to accept user input indicating selection or acceptance of an element in the user interface. A home button 710(3) may be provided, which when activated, initiates presentation of a home menu. A back button 710(4) may be configured to transition the user interface back to a previous condition, menu level, and so forth.

A play/pause button 710(5) may allow for the initiation and suspension of presentation of content. In some implementations the play/pause button 710(5) may also allow for the input of a stop to presentation. For example, a momentary press of the button 710(5) having a duration of less than 500 milliseconds (ms) may result in a toggle between a play and a pause state. A longer press of the button 710(5) that lasts for 500 ms or more may result in initiating a stop of the content 104 presentation.

A previous button 710(6) may allow for functions such as rewinding the presentation of the content, jumping to an earlier point in the content, and so forth. Similarly, a next button 710(7) may be configured to move forward in the content during presentation, jump to a later point in the content 104, and so forth.

A voice button 710(8) activates a playback system to accept verbal input. For example, pressing the voice button 710(8) may initiate acquisition of data from the microphone 712 and sending the data to the playback system or a media controller thereof.

Other buttons may be provided, such as a power button, volume up button 710(9), volume down button 710(10), and so forth. In some embodiments, a multi-speaker volume adjustment component overrides the default behavior of the volume control button when certain applications (e.g., audio playback application) are being used.

The remote control 700 also includes one or more communication interfaces 720. The communications interfaces 720 may include an RF interface 720(1) and an infrared interface 720(2).

The memory 704 may store one or more of an operating system module 722, a remote control module 724, or other modules 726. The operating system module 722 may be similar to that described above with regard to 412 (not shown or described above). The remote control module 724 is configured to manage inputs and outputs from the I/O devices of the remote control 700 and exchanges data associated with the inputs and output with the media controller. The other modules 726 in the memory 704 may include an RF to infrared repeater module, speech recognition module, audio encoder module, and so forth.

Figure 8:
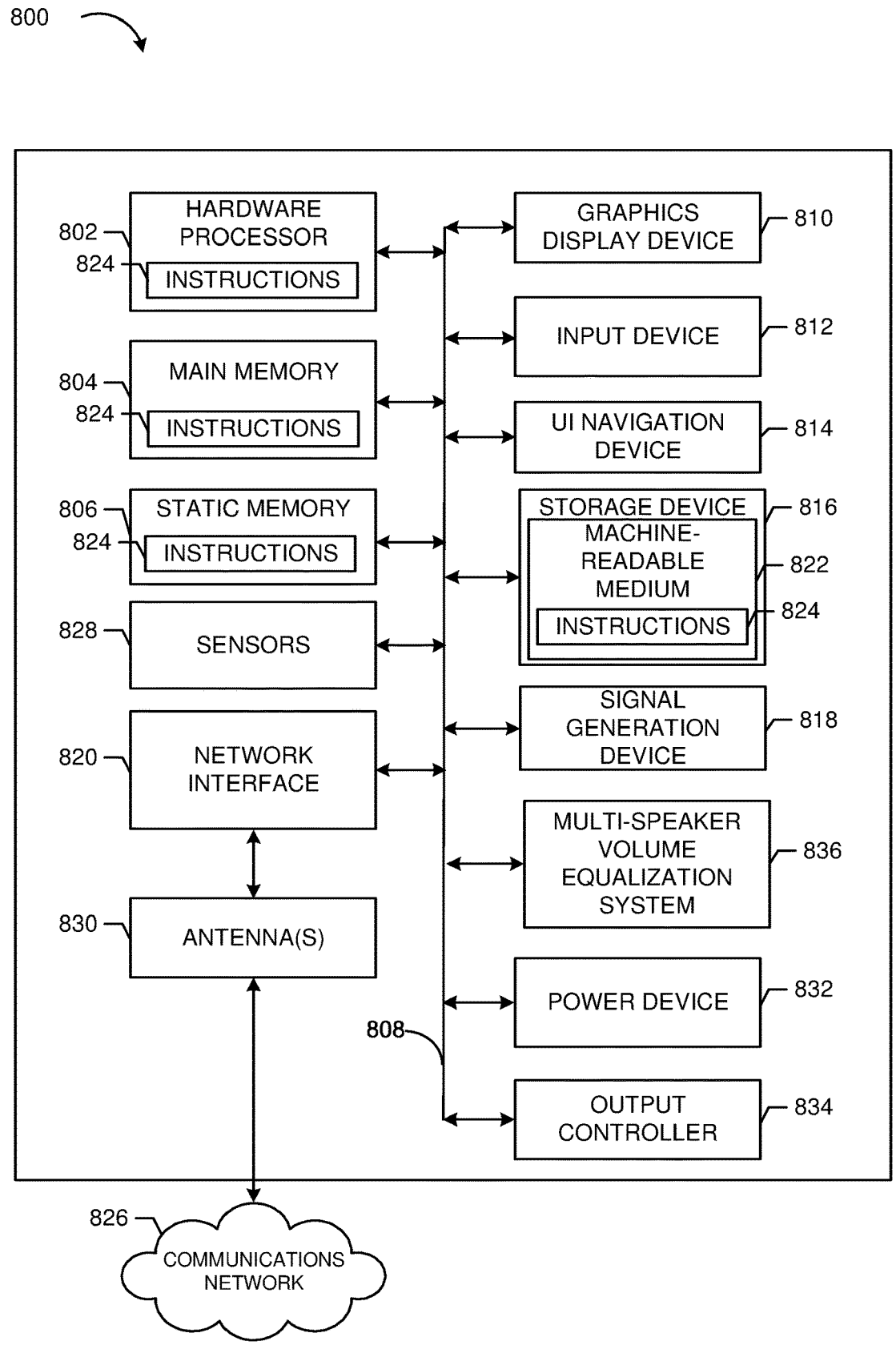
FIG. 8 illustrates a block diagram of an example machine upon which any of one or more techniques (e.g., methods) may be performed, in accordance with one or more example embodiments of the present disclosure.

FIG. 8 illustrates a block diagram of an example of a machine 800 (e.g., implemented in whole or in part in the context of embodiments described in connection with other figures. In some embodiments, the machine 800 may operate as a standalone device or may be connected (e.g., networked) to other machines. In a networked deployment, the machine 800 may operate in the capacity of a server machine, a client machine, or both in server-client network environments. In an example, the machine 800 may act as a peer machine in Wi-Fi direct, peer-to-peer (P2P) (or other distributed) network environments. The machine 800 may be a wearable device or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), or other computer cluster configurations.

Examples, as described herein, may include or may operate on logic or a number of components, modules, or mechanisms. Modules are tangible entities (e.g., hardware) capable of performing specified operations when operating. A module includes hardware. In an example, the hardware may be specifically configured to carry out a specific operation (e.g., hardwired). In another example, the hardware may include configurable execution units (e.g., transistors, circuits, etc.) and a computer readable medium containing instructions where the instructions configure the execution units to carry out a specific operation when in operation. The configuring may occur under the direction of the execution units or a loading mechanism. Accordingly, the execution units are communicatively coupled to the computer-readable medium when the device is operating. In this example, the execution units may be a member of more than one module. For example, under operation, the execution units may be configured by a first set of instructions to implement a first module at one point in time and reconfigured by a second set of instructions to implement a second module at a second point in time.

The machine (e.g., computer system) 800 may include any combination of the illustrated components. For example, the machine 800 may include a hardware processor 802 (e.g., a central processing unit (CPU), a graphics processing unit (GPU), a hardware processor core, or any combination thereof), a main memory 804 and a static memory 806, some or all of which may communicate with each other via an interlink (e.g., bus) 808. The machine 800 may further include a power management device 832, a graphics display device 810, an alphanumeric input device 812 (e.g., a keyboard), and a user interface (UI) navigation device 814 (e.g., a mouse). In an example, the graphics display device 810, alphanumeric input device 812, and UI navigation device 814 may be a touch screen display. The machine 800 may additionally include a storage device (e.g., drive unit) 816, a signal generation device 818, and a network interface device/transceiver 820 coupled to antenna(s) 830. The machine 800 may include an output controller 834, such as a serial (e.g., universal serial bus (USB), parallel, or other wired or wireless (e.g., infrared (IR), near field communication (NFC), etc.) connection to communicate with or control one or more peripheral devices (e.g., a printer, a card reader, other sensors 828, etc.).

The storage device 816 may include a machine readable medium 822 on which is stored one or more sets of data structures or instructions 824 (e.g., software) embodying or utilized by any one or more of the techniques or functions described herein. The instructions 824 may also reside, completely or at least partially, within the main memory 804, within the static memory 806, or within the hardware processor 802 during execution thereof by the machine 800. In an example, one or any combination of the hardware processor 802, the main memory 804, the static memory 806, or the storage device 816 may constitute machine-readable media.

Multi-speaker volume equalization System 836 may refer to hardware, software, or a combination thereof that adjusts the volume of audio content in a non-uniform manner. Multi-speaker volume equalization System 836 may be implemented based on techniques described in connection with FIG. 1, and may be used to perform processes such as those described in connection with FIG. 6 and FIG. 7.

While the machine-readable medium 822 is illustrated as a single medium, the term "machine-readable medium" may include a single medium or multiple media (e.g., a centralized or distributed database, and/or associated caches and servers) configured to store the one or more instructions 824.

Various embodiments may be implemented fully or partially in software and/or firmware. This software and/or firmware may take the form of instructions contained in or on a non-transitory computer-readable storage medium. Those instructions may then be read and executed by one or more processors to enable performance of the operations described herein. The instructions may be in any suitable form, such as but not limited to source code, compiled code, interpreted code, executable code, static code, dynamic code, and the like. Such a computer-readable medium may include any tangible non-transitory medium for storing information in a form readable by one or more computers, such as but not limited to read only memory (ROM); random access memory (RAM); magnetic disk storage media; optical storage media; a flash memory, etc.

The term "machine-readable medium" may include any medium that is capable of storing, encoding, or carrying instructions for execution by the machine 800 and that cause the machine 800 to perform any one or more of the techniques of the present disclosure, or that is capable of storing, encoding, or carrying data structures used by or associated with such instructions. Non-limiting machine-readable medium examples may include solid-state memories and optical and magnetic media. In an example, a massed machine-readable medium includes a machine-readable medium with a plurality of particles having resting mass. Specific examples of massed machine-readable media may include non-volatile memory, such as semiconductor memory devices (e.g., electrically programmable read-only memory (EPROM), or electrically erasable programmable read-only memory (EEPROM)) and flash memory devices; magnetic disks, such as internal hard disks and removable disks; magneto-optical disks; and CD-ROM and DVD-ROM disks.

The instructions 824 may further be transmitted or received over a communications network 826 using a transmission medium via the network interface device/transceiver 820 utilizing any one of a number of transfer protocols (e.g., frame relay, internet protocol (IP), transmission control protocol (TCP), user datagram protocol (UDP), hypertext transfer protocol (HTTP), etc.). Example communications networks may include a local area network (LAN), a wide area network (WAN), a packet data network (e.g., the Internet), mobile telephone networks (e.g., cellular networks), plain old telephone (POTS) networks, wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, and peer-to-peer (P2P) networks, among others. In an example, the network interface device/transceiver 820 may include one or more physical jacks (e.g., Ethernet, coaxial, or phone jacks) or one or more antennas to connect to the communications network 826. In an example, the network interface device/transceiver 820 may include a plurality of antennas to wirelessly communicate using at least one of single-input multiple-output (SIMO), multiple-input multiple-output (MIMO), or multiple-input single-output (MISO) techniques. The term "transmission medium" shall be taken to include any intangible medium that is capable of storing, encoding, or carrying instructions for execution by the machine 800 and includes digital or analog communications signals or other intangible media to facilitate communication of such software.

The operations and processes described and shown above may be carried out or performed in any suitable order as desired in various implementations. Additionally, in certain implementations, at least a portion of the operations may be carried out in parallel. Furthermore, in certain implementations, less than or more than the operations described may be performed.

The word "exemplary" is used herein to mean "serving as an example, instance, or illustration." Any embodiment described herein as "exemplary" is not necessarily to be construed as preferred or advantageous over other embodiments. The terms "computing device," "user device," "communication station," "station," "handheld device," "mobile device," "wireless device" and "user equipment" (UE) as used herein refers to a wireless communication device such as a cellular telephone, a smartphone, a tablet, a netbook, a wireless terminal, a laptop computer, a femtocell, a high data rate (HDR) subscriber station, an access point, a printer, a point of sale device, an access terminal, or other personal communication system (PCS) device. The device may be either mobile or stationary.

As used within this document, the term "communicate" is intended to include transmitting, or receiving, or both transmitting and receiving. This may be particularly useful in claims when describing the organization of data that is being transmitted by one device and received by another, but only the functionality of one of those devices is required to infringe the claim. Similarly, the bidirectional exchange of data between two devices (both devices transmit and receive during the exchange) may be described as "communicating," when only the functionality of one of those devices is being claimed. The term "communicating" as used herein with respect to a wireless communication signal includes transmitting the wireless communication signal and/or receiving the wireless communication signal. For example, a wireless communication unit, which is capable of communicating a wireless communication signal, may include a wireless transmitter to transmit the wireless communication signal to at least one other wireless communication unit, and/or a wireless communication receiver to receive the wireless communication signal from at least one other wireless communication unit.

As used herein, unless otherwise specified, the use of the ordinal adjectives "first," "second," "third," etc., to describe a common object, merely indicates that different instances of like objects are being referred to and are not intended to imply that the objects so described must be in a given sequence, either temporally, spatially, in ranking, or in any other manner.

Some embodiments may be used in conjunction with various devices and systems, for example, a personal computer (PC), a desktop computer, a mobile computer, a laptop computer, a notebook computer, a tablet computer, a server computer, a handheld computer, a handheld device, a personal digital assistant (PDA) device, a handheld PDA device, an on-board device, an off-board device, a hybrid device, a vehicular device, a non-vehicular device, a mobile or portable device, a consumer device, a non-mobile or non-portable device, a wireless communication station, a wireless communication device, a wireless access point (AP), a wired or wireless router, a wired or wireless modem, a video device, an audio device, an audio-video (A/V) device, a wired or wireless network, a wireless area network, a wireless video area network (WVAN), a local area network (LAN), a wireless LAN (WLAN), a personal area network (PAN), a wireless PAN (WPAN), and the like.

Some embodiments may be used in conjunction with one way and/or two-way radio communication systems, biomedical sensors, wearable devices or sensors, cellular radio-telephone communication systems, a mobile phone, a cellular telephone, a wireless telephone, a personal communication system (PCS) device, a PDA device which incorporates a wireless communication device, a mobile or portable global positioning system (GPS) device, a device which incorporates a GPS receiver or transceiver or chip, a device which incorporates an RFID element or chip, a multiple input multiple output (MIMO) transceiver or device, a single input multiple output (SIMO) transceiver or device, a multiple input single output (MISO) transceiver or device, a device having one or more internal antennas and/or external antennas, digital video broadcast (DVB) devices or systems, multi-standard radio devices or systems, a wired or wireless handheld device, e.g., a smartphone, a wireless application protocol (WAP) device, or the like.

Some embodiments may be used in conjunction with one or more types of wireless communication signals and/or systems following one or more wireless communication protocols, for example, radio frequency (RF), infrared (IR), frequency-division multiplexing (FDM), orthogonal FDM (OFDM), time-division multiplexing (TDM), time-division multiple access (TDMA), extended TDMA (E-TDMA), general packet radio service (GPRS), extended GPRS, code-division multiple access (CDMA), wideband CDMA (WCDMA), CDMA 2000, single-carrier CDMA, multi-carrier CDMA, multi-carrier modulation (MDM), discrete multi-tone (DMT), Bluetooth®, global positioning system (GPS), Wi-Fi, Wi-Max, ZigBee, ultra-wideband (UWB), global system for mobile communications (GSM), 2G, 2.5G, 3G, 3.5G, 4G, fifth generation (5G) mobile networks, 3GPP, long term evolution (LTE), LTE advanced, enhanced data rates for GSM Evolution (EDGE), or the like. Other embodiments may be used in various other devices, systems, and/or networks.

It is understood that the above descriptions are for purposes of illustration and are not meant to be limiting.

Although specific embodiments of the disclosure have been described, one of ordinary skill in the art will recognize that numerous other modifications and alternative embodiments are within the scope of the disclosure. For example, any of the functionality and/or processing capabilities described with respect to a particular device or component may be performed by any other device or component. Further, while various illustrative implementations and architectures have been described in accordance with embodiments of the disclosure, one of ordinary skill in the art will appreciate that numerous other modifications to the illustrative implementations and architectures described herein are also within the scope of this disclosure.

Program module(s), applications, or the like disclosed herein may include one or more software components including, for example, software objects, methods, data structures, or the like. Each such software component may include computer-executable instructions that, responsive to execution, cause at least a portion of the functionality described herein (e.g., one or more operations of the illustrative methods described herein) to be performed.

A software component may be coded in any of a variety of programming languages. An illustrative programming language may be a lower-level programming language such as an assembly language associated with a particular hardware architecture and/or operating system platform. A software component comprising assembly language instructions may require conversion into executable machine code by an assembler prior to execution by the hardware architecture and/or platform.

Another example programming language may be a higher-level programming language that may be portable across multiple architectures. A software component comprising higher-level programming language instructions may require conversion to an intermediate representation by an interpreter or a compiler prior to execution.

Other examples of programming languages include, but are not limited to, a macro language, a shell or command language, a job control language, a script language, a database query or search language, or a report writing language. In one or more example embodiments, a software component comprising instructions in one of the foregoing examples of programming languages may be executed directly by an operating system or other software component without having to be first transformed into another form.

A software component may be stored as a file or other data storage construct. Software components of a similar type or functionally related may be stored together such as, for example, in a particular directory, folder, or library. Software components may be static (e.g., pre-established or fixed) or dynamic (e.g., created or modified at the time of execution).

Software components may invoke or be invoked by other software components through any of a wide variety of mechanisms. Invoked or invoking software components may comprise other custom-developed application software, operating system functionality (e.g., device drivers, data storage (e.g., file management) routines, other common routines and services, etc.), or third-party software components (e.g., middleware, encryption, or other security software, database management software, file transfer or other network communication software, mathematical or statistical software, image processing software, and format translation software).

Software components associated with a particular solution or system may reside and be executed on a single platform or may be distributed across multiple platforms. The multiple platforms may be associated with more than one hardware vendor, underlying chip technology, or operating system. Furthermore, software components associated with a particular solution or system may be initially written in one or more programming languages, but may invoke software components written in another programming language.

Computer-executable program instructions may be loaded onto a special-purpose computer or other particular machine, a processor, or other programmable data processing apparatus to produce a particular machine, such that execution of the instructions on the computer, processor, or other programmable data processing apparatus causes one or more functions or operations specified in any applicable flow diagrams to be performed. These computer program instructions may also be stored in a computer-readable storage medium (CRSM) that upon execution may direct a computer or other programmable data processing apparatus to function in a particular manner, such that the instructions stored in the computer-readable storage medium produce an article of manufacture including instruction means that implement one or more functions or operations specified in any flow diagrams. The computer program instructions may also be loaded onto a computer or other programmable data processing apparatus to cause a series of operational elements or steps to be performed on the computer or other programmable apparatus to produce a computer-implemented process.

Additional types of CRSM that may be present in any of the devices described herein may include, but are not limited to, programmable random access memory (PRAM), SRAM, DRAM, RAM, ROM, electrically erasable programmable read-only memory (EEPROM), flash memory or other memory technology, compact disc read-only memory (CD-ROM), digital versatile disc (DVD) or other optical storage, magnetic cassettes, magnetic tape, magnetic disk storage or other magnetic storage devices, or any other medium which may be used to store the information and which may be accessed. Combinations of any of the above are also included within the scope of CRSM. Alternatively, computer-readable communication media (CRCM) may include computer-readable instructions, program module(s), or other data transmitted within a data signal, such as a carrier wave, or other transmission. However, as used herein, CRSM does not include CRCM.

Although embodiments have been described in language specific to structural features and/or methodological acts, it is to be understood that the disclosure is not necessarily limited to the specific features or acts described. Rather, the specific features and acts are disclosed as illustrative forms of implementing the embodiments. Conditional language, such as, among others, "can," "could," "might," or "may," unless specifically stated otherwise, or otherwise understood within the context as used, is generally intended to convey that certain embodiments could include, while other embodiments do not include, certain features, elements, and/or steps. Thus, such conditional language is not generally intended to imply that features, elements, and/or steps are in any way required for one or more embodiments or that one or more embodiments necessarily include logic for deciding, with or without user input or prompting, whether these features, elements, and/or steps are included or are to be performed in any particular embodiment.

What is claimed is:

1. A computer-implemented method, comprising:
    diarizing multimedia content into a plurality of stems, wherein the multimedia content comprises audio content and video content;
    computing mean and variance volume information for the plurality of stems;
    receiving, a request to play the multimedia content for a user;
    determining a first set of target volume levels for the plurality of stems;
    causing, at a first time, the multimedia content to be played for the user according to the first set of target volumes;
    receiving, at a second time, a volume control command from the user;
    determining speech contextual information of the audio content being played at the second time;
    recording user feedback information based on the received volume control command;
    training a machine-learning model based on the multimedia content and the user feedback to infer a second set of target volume levels for the plurality of stems; and
    performing a relative volume level adjustment between first and second stems of the plurality of stems based on the second set of target volume levels.

2. The computer-implemented method of claim 1, further comprising:
    providing, to the user, a graphical interface comprising a plurality of volume controls;
    receiving, from the user, an indication to increase volume of the first stem; and
    increasing a first volume level for the first stem and increasing a second volume level for the second stem, wherein a variance between the first stem and second stem is maintained.

3. The computer-implemented method of claim 1, wherein determining the speech contextual information comprises analyzing video being played at the second time to determine emotion information.

4. The computer-implemented method of claim 1, wherein
    the machine-learning model comprises an autoencoder and a generative adversarial network; and
    training the machine-learning model comprises performing reinforcement learning using the autoencoder and the generative adversarial network to determine the second set of target volume levels for the plurality of stems.

5. A system, comprising:
one or more processors; and
memory storing executable instructions that, as a result of execution by the one or more processors, cause the system to:
    determine a plurality of stems for digital content comprising audio;
    receive, at a first time, a volume control command from a user during playback of the digital content;
    in response to the volume control command:
        determining, using a machine-learning model, a first volume adjustment to a first stem of the digital content;
        determining, using the machine-learning model, a second volume adjustment to a second stem of the digital content; and
        wherein the first volume adjustment and the second volume adjustment maintain a relative difference in volume levels between the first stem and the second stem;

wherein the machine-learning model is trained to infer a set of target volume levels for the plurality of stems based on historical volume control commands issued by the user; and perform a relative volume level adjustment between the first and second stems based on the set of target volume levels.

6. The system of claim 5, wherein executable instructions include further instructions that, as a result of execution by the one or more processors, further cause the system to:

diarize the digital content into a plurality of stems;

compute mean and variance volume information for the plurality of stems; and determine the set of target volume levels based at least in part on the computed mean and variance volume information.

7. The system of claim 5, wherein the set of target volume levels is determined further based at least in part on paralinguistic information detected at the first time.

8. The system of claim 7, wherein the paralinguistic information is processed based on video of the digital content at the first time.

9. The system of claim 5, wherein:

a variance in volume between the first stem and the second stem is maintained; and an average volume of the digital content is increased or decreased in response to the volume control command.

10. The system of claim 5, wherein the first volume adjustment is an increase in volume of the first stem and the second volume adjustment is a decrease in volume of the second stem.

11. The system of claim 5, wherein:

the first stem is associated with a first speaker identity and the second stem is associated with a second stem identity; and the machine-learning model is trained further based on the first speaker identity and the second speaker identity.

12. The system of claim 11, wherein at least one stem of the plurality of stems corresponds to the first speaker identity corresponds to a first latent representation of one or more paralinguistic characteristics.

13. A non-transitory computer-readable storage medium storing executable instructions that, as a result of being executed by one or more processors of a computer system, cause the computer system to at least:

determine a plurality of stems for digital content comprising audio;

receive, at a first time, a volume control command from a user during playback of the digital content;

in response to the volume control command:

determining, using a machine-learning model, a first volume adjustment to a first stem of the digital content;

determining, using the machine-learning model, a second volume adjustment to a second stem of the digital content; and wherein the first volume adjustment and the second volume adjustment maintain a relative difference in volume levels between the first stem and the second stem; and wherein the machine-learning model is trained to infer a set of target volume levels for the plurality of stems based on historical volume control commands issued by the user; and perform a relative volume level adjustment between the first and second stems based on the set of target volume levels.

14. The non-transitory computer-readable storage medium of claim 13, instructions, as a result of being executed by the one or more processors of the computer system, further cause the system to:

perform speaker diarization and background noise separate of the digital content to determine a plurality of stems;

compute mean and variance volume information for the plurality of stems; and determine the set of target volume levels based at least in part on the computed mean and variance volume information.

15. The non-transitory computer-readable storage medium of claim 13, wherein the set of target volume levels is determined further based at least in part on emotion context detected at the first time.

16. The non-transitory computer-readable storage medium of claim 15, wherein the emotion context is processed based on video of the multimedia content at the first time.

17. The non-transitory computer-readable storage medium of claim 13, wherein:

a variance in volume between the first stem and the second stem is maintained; and an average volume of the digital content is increased or decreased in response to the volume control command.

18. The non-transitory computer-readable storage medium of claim 13, wherein the first volume adjustment is an increase in volume of the first stem and the second volume adjustment is a decrease in volume of the second stem.

19. The non-transitory computer-readable storage medium of claim 13, the first stem is associated with a first speaker identity and the second stem is associated with a second stem identity; and the machine-learning model is trained further based on the first speaker identity and the second speaker identity.

20. The non-transitory computer-readable storage medium of claim 13, wherein at least one stem of the plurality of stems corresponds to a background stem.

* * * * *